United States Patent [19]
Spinner

[11] Patent Number: 5,686,833
[45] Date of Patent: Nov. 11, 1997

[54] LOAD BOARD ENHANCED FOR DIFFERENTIAL PRESSURE RETENTION IN AN IC TEST HEAD

[76] Inventor: Howard D. Spinner, 16456 Hilow Rd., Los Gatos, Calif. 95032

[21] Appl. No.: 526,716

[22] Filed: Sep. 11, 1995

Related U.S. Application Data

[63] Continuation-in-part of Ser. No. 509,389, Jul. 31, 1995.
[51] Int. Cl.[6] ................................................. G01R 31/02
[52] U.S. Cl. ......................................... 324/158.1; 324/754
[58] Field of Search ............................... 324/158.1, 73.1, 324/754, 758

[56] References Cited

U.S. PATENT DOCUMENTS

| | | | |
|---|---|---|---|
| 4,017,793 | 4/1977 | Haines | 324/763 |
| 4,164,704 | 8/1979 | Kato et al. | 324/758 |
| 4,229,693 | 10/1980 | Irick et al. | 324/754 |
| 4,551,675 | 11/1985 | Heys et al. | 324/754 |
| 4,947,112 | 8/1990 | Gaston et al. | 324/754 |

*Primary Examiner*—Ernest F. Karlsen
*Attorney, Agent, or Firm*—Donald R. Boys

[57] ABSTRACT

A load board for an IC test apparatus has a film of self-supporting material mounted by adhesive to one side of the load board, covering through-holes in the load board, but exposing contact pads on the surface to which the self-supporting film is mounted. In preparing the load board, a self-supporting film is cut to shape for the load board, and openings are made in areas where contact pads must be exposed to make contact with off-board circuitry. The film is then mounted to the load board by adhesive, which may be applied in conventional ways, such as by spraying or spreading. In some embodiments film is used that has a pre-applied adhesive and a protective film layer over the adhesive. In these embodiments, the protective film is peeled away, and the film is applied to the load board.

6 Claims, 15 Drawing Sheets

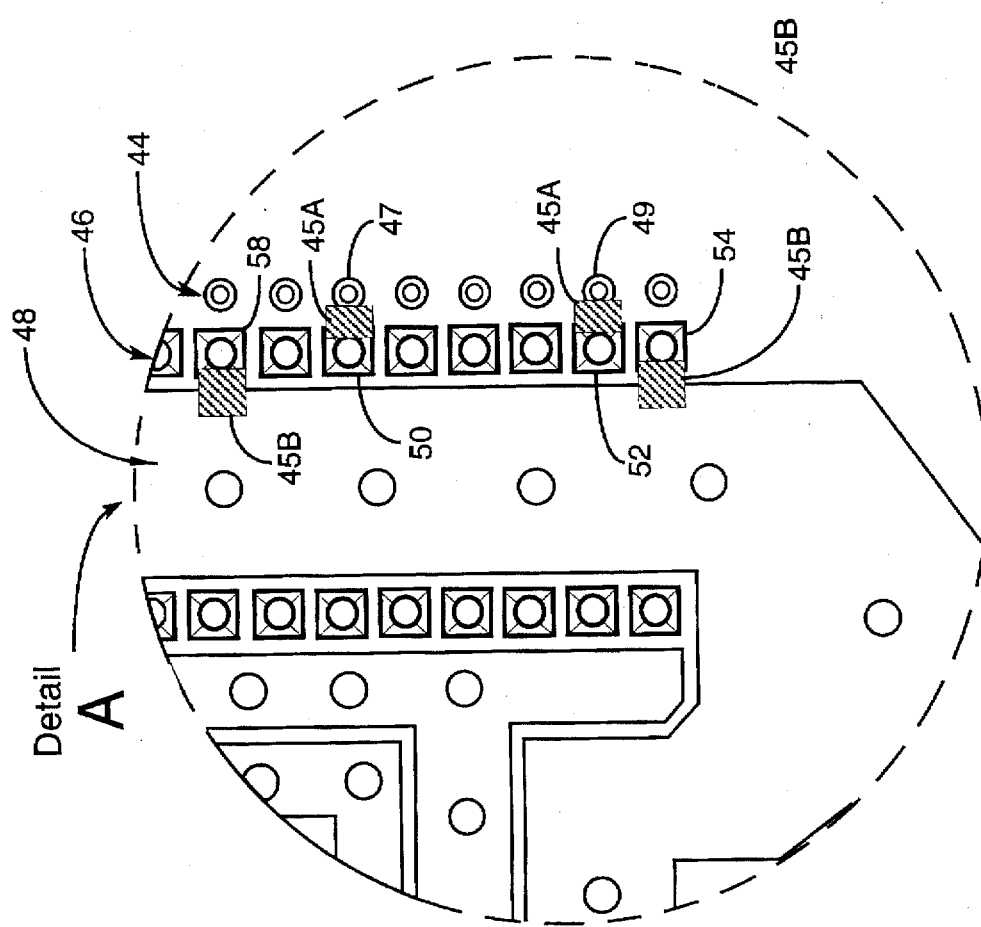

LOAD BOARD ENHANCED FOR DIFFERENTIAL PRESSURE RETENTION IN AN IC TEST HEAD

CROSS REFERENCE TO RELATED APPLICATIONS

The present application is a continuation-in-part of application Ser. No. 08/509,389, filed Jul. 31, 1995, pending, which is incorporated herein in its entirety by reference.

FIELD OF THE INVENTION

The present invention is in the area of methods and apparatus for testing integrated circuits (ICs), and pertains more particularly to mounting and retaining printed circuit boards (PCBs) called load boards in the art, to test heads in computerized test apparatus.

BACKGROUND OF THE INVENTION

At the time of the present invention, integrated circuits (ICs) in a wide variety of sizes and for a wide variety of purposes have been developed and commercialized. ICs are typically rectangularly shaped dies, also called chips, of semiconducting silicon upon which solid state transistors and interconnecting circuitry have been constructed, and connection to off-chip circuitry is provided through contact leads and bonding pads arranged around a periphery of such a chip.

To protect an IC die and to provide a standard physical interface to, for example, a printed circuit board, such die are typically encapsulated in plastic or ceramic material with wires bonded to bonding pads on a die and to conductive leads leading away from the die. The conductive leads are ultimately soldered to electrical traces on a printed circuit board for use in any one of many electronic applications.

It has been a trend in the art to accomplish increased device density and smaller circuitry dimensions in ICs, to provide more circuitry in a smaller space. There is a trend as well to accomplish increased speed at which an IC operates. As ICs become more complex and powerful as a result, thorough testing of many thousands (sometimes millions) of transistors and miles of interconnective traces has become ever more critical. Typically, an effort is made to test every transistor and every connection of an IC to assure proper operation.

The present invention is in the area of test apparatus for testing ICs. In following descriptions and discussions, ICs to be tested and under test will be referred to generally as device-under-test (DUT), as is common in the art.

Partly because of a trend to smaller die and to more contacts to the outside world from an IC, reliably connecting bonding pads on a die to perform thorough testing is not a simple exercise. Because of this, most ICs are tested after packaging, although in some cases ICs are tested before packaging, and even before individual ICs are separated from semiconductor wafers upon which they are constructed. Methods are also being developed to mount ICs on circuit boards without packaging.

The IC testing process is historically one of placing a packaged IC in a test socket, with leads of the IC making electrical contact with contact pads or lands in a socket. In present art, a computerized tester, to be more fully described below, comprising a CPU, power supply, suitable memory, and control routines developed for testing an IC, provides test vectors, power, and ground connections through an interface harness to a test head. In a test head, power, ground, and vector signal lines are interfaced through a somewhat complex distribution system, which includes adapter module boards, and provided finally to leads of a DUT placed in a test socket connected to a load board.

Typically, each individual DUT has a dedicated set of software control routines to be executed on a tester to provide a serial stream of test vectors for a DUT. There will also typically be an especially designed and constructed load board for a unique type of DUT, and a specific socket interfaced to a load board, and a particular power and ground connection to suit the unique configuration of the DUT.

In design and development of an IC, information is also used to develop software for testing ICs manufactured according to a particular design. A customized load board and a customized socket is also typically developed. One may have, for example, a batch of 100 packaged ICs of a particular design to be tested. To prepare to test these devices, a customized load board is assembled to a test head. A test socket, with connections configured to meet appropriate leads on a DUT, is assembled to the board, and customized software for that DUT is loaded into a test system.

After a test apparatus is customized to a DUT and a dedicated software is loaded, the 100 DUT's are installed and removed serially, with a test vector set applied to each in order. Typically, if a DUT fails, a test system reports the failure. After the 100 devices are tested, much of a test system (tester, software, load board, socket) is reconfigured for a new batch of DUT types to be tested. Test systems are sometimes manual, and sometimes complex material handling systems may be interfaced to a test system for presenting DUTs to a tester.

The shape and size of IC packages varies, the number of leads varies from type to type, the size and geometry of leads varies, the position of leads where the power supply voltages and grounds must be applied differs from type to type, and so on. Different standard packages are given names, such as dual in-line package (DIP) and quad flat package (QFP). In current art, load boards are designed and manufactured to fit a unique configuration of each DUT.

In many cases, although a single load board may be able to serve a variety of different DUTs having a common package configuration and lead geometry and configuration, power connections and ground lead locations will vary. Load boards, in these cases, have to be configured somehow so power supply and ground connections match with connective requirements of a unique DUT.

In some instances, user's prefer a completely customized board, so power and ground connections terminate at points aligning with socket connections. This is a relatively expensive solution, requiring an entirely different, fully customized board for each DUT, even if several devices to be tested have a common size and lead configuration and can be interfaced to a common socket.

An alternative solution is to bring signal leads to all lead positions at an interface area on a load board, and to provide power and ground points or pads nearby each lead position. Then power and ground may be jumpered to appropriate points at the interface according to the unique requirements for each DUT. In this manner, a common load board may be provided for a large number of DUTs, and customization is done on the common board by one or another finishing technique.

One method of finishing and customizing a load board of the type described above, involves hand-soldering a solder bridge or a jumper wire from power and ground locations nearby, to pads contiguous with through-holes to which socket or receptacle pins may be mounted. That is, given a pattern, for example, of through-holes on a load board to which pins of a receptacle or a socket will be engaged, the through-holes typically corresponding to the leads of a DUT, one simply provides a jumper one-at-a-time to each through-hole for a pin requiring power or ground.

There are some problems inherent in soldering on such a load board, however. Plated through-holes and solder pads on a load board are typically very small and necessarily closely-spaced. This makes such a soldering process, either with or without jumper wires, time-consuming, costly, and somewhat risky. Such solder connections must be very carefully made on a board that may represent a several thousand dollar investment, without damaging plated through-holes, contact pads, or surface of the load board. An improper connection or damaged test surface may mean a scrapped board and costly delays.

A new apparatus and method for customizing load boards quickly, inexpensively, and without risk of loss and delay is clearly needed.

For those leads of a DUT that require power, it is conventional in the art that a power connection be made to each such lead, and, during testing each of these leads is typically hot. Still, during testing, depending on the test vectors provided, the power draw on each such lead varies. At various times a relatively sudden demand for increased power may be made on one lead or another, or on all power leads at the same time.

When a demand for power is relatively sudden, due to multiple junctures and often necessarily small cross-section of conductive paths for power from a power supply to final connection to leads of a DUT, it has become a practice to provide decoupling capacitors near each power lead connection, with one end of the capacitor connected as close as is practical to the power lead, and the other connected to ground. These decoupling capacitors are typically and conventionally mounted between plated through-holes and a ground plane on the backside of a load board; that is, the side opposite the side where a receptacle and a test socket are mounted.

To provide the best possible decoupling for power leads, closer coupling of capacitors to power leads is needed.

Another problem attendant to test heads and varying requirements for connecting test vectors to DUTs is in the mounting and retention of load boards. Load boards have typically been physically registered and mounted to test heads, and retained by conventional fasteners, such as socket head screws and the like. A more detailed description of test systems, including printed load boards, is provided below, in the section entitled "Description of the Preferred Embodiments".

In situations where load boards have to be changed often on a test head, mounting by fasteners can be cumbersome and inconvenient. Moreover, a load board has, in some cases, hundreds of pads which have to make intimate electrical connection to pogo pins from pin electronics boards in the test head. Mounting has to be precise for all such connections to be reliably made, and in the event tests indicate one or more connections are faulty, adjustment of the load board mounting has to be made.

For these and other reasons, some test head manufacturers are now maintaining the inside of a test head under partial vacuum, and mounting load boards thereon, against a set of concentric o-rings, such that the load board is retained and pulled against pogo pins from pin electronics boards by pressure differential across the load board.

To accomplish vacuum mounting, it is necessary that through-holes in a load board be covered. To the present, methods and apparatus for rendering load boards capable of being mounted to a vacuum test head have been decidedly less than satisfactory. For example, one of the principle methods in use is to coat over one side (the backside) of a load board with dry-film solder-mask material, closing all through-holes in the process. A through-hole, by this process, is capped at one end of the hole with a relatively thin layer of dry-film solder mask. Typically, only one end is capped, because most users of such boards want to be able to insert a diagnostic probe, such as from an oscilloscope, into the hole from the open end.

A recurring problem with this method for closing through-holes to make a load board vacuum tight, is that the solder mask material is thin and fragile, and subject to early failure. Tests have shown that a probe or other device urged against solder mask closing one end of a through-hole, need only be urged with a force of about two ounces to rupture the solder mask material. In the event of a rupture, in many cases the board cannot remain mounted. Moreover, brittle solder mask material from a ruptured closure may damage components within a test head, and may certainly pose a threat to a vacuum pump or pumps used to maintain a partial vacuum in a test head against a load board.

What is needed in this case is a load board enhanced by a material more suitable to pressure differential across the material, so failure due to vacuum and accidental damage by probes can be eliminated.

SUMMARY OF THE INVENTION

In a preferred embodiment of the present invention a method is provided for customizing a printed circuit board (PCB), comprising steps of (a) registering a template to the PCB, the template having an opening in registration defining a volume on the PCB where a conductive trace or jumper is desired; (b) placing a semi-liquid conductive polymer in the opening; (c) removing the template, leaving a conductive polymer trace or jumper on the PCB; and (d) curing the conductive polymer. The method is particularly applicable to PCBs used as load boards for IC testing apparatus.

In another aspect of the invention a Smart Receptacle is provided for connecting a test socket to a load board in an IC test apparatus. The Smart Receptacle has board engagement pins extending from the Smart Receptacle for connecting to holes in the load board, socket apertures in the Smart Receptacle connected to the board engagement pins, a ground plane connected by one or more ground pins to one or more ground-connected holes in the load board, and a decoupling capacitor mounted through the Smart Receptacle. One end of the decoupling capacitor is jumpered to one of the socket apertures, and the opposite end of the decoupling capacitor is jumpered to the ground plane.

In a preferred embodiment a Smart Receptacle according to the invention has jumpers for connecting decoupling capacitors made by registering a template to the Smart Receptacle, the template having openings in registration defining a volume on the load board where jumpers are required, placing a semi-liquid conductive polymer in the openings, removing the template, leaving a conductive polymer trace or jumper on the load board, and curing the conductive polymer. Smart receptacles are also provided having a power plane connected by one or more power pins to one or more power-connected holes in the load board, and jumpers are made from the power plane to individual ones of the decoupling capacitors and the socket apertures.

The method of making traces and jumpers by thick-film application of conductive polymer material provides a way to customize as well as to repair printed circuit boards. The application to load boards for testing apparatus reduces both cost and delay time for users to customize apparatus for particular DUTs, and further significantly improves operation of such systems by moving decoupling capacitors, ground, and sense lines closer to DUTs than has before been possible.

In yet another embodiment and aspect of the present invention a load board is provided for vacuum-chuck mounting to a test head of an IC test apparatus, comprising a pattern of pads on a first side of the load board for contact with pins of an external circuit; plated through-holes passing from the first side to a second side, allowing testing of electrical characteristics on the first side from the second side; and a film mounted to the first side, closing the through-holes on the first side but exposing the pads. The film is of a material self-supporting before application to the load board.

In some cases the film is Mylar™ or Kapton™ material, and in some of these cases the film before mounting has a pre-applied adhesive protected with a second film, such that the second film may be peeled before application of the first film to the load board.

An IC test apparatus is provided comprising a test head having a mounted load board for conducting test vectors to a test socket for an IC; and a vacuum chamber fashioned within the test head, the vacuum chamber having an opening defined by vacuum seals with the load board covering the opening against the vacuum seals. The load board has a pattern of pads on a first side for contact with pins of an external circuit; plated through-holes passing from the first side to a second side, allowing testing of electrical characteristics on the first side from the second side; and a film of a material self-supporting before application to the load board, the film mounted to the first side, closing the through-holes on the first side but exposing the pads.

A method is provided for rendering a load board for an IC test apparatus capable of being mounted to a vacuum chuck, comprising steps of: (a) preparing a self-supporting film for mounting to the load board by fashioning openings for contact pads of the load board; and (b) mounting the self-supporting film to the load board by means of an adhesive, positioned so through-holes on the load board are covered, and contact pads on the load board are exposed by the opening fashioned in the self-supporting film.

Load boards fashioned according to the present invention have an inherent advantage in that they are not vulnerable to cracking or breaking of the material used to close through-holes to make boards vacuum-tight. The method is also cleaner and neater than prior art methods and apparatus, and may well be less expensive.

BRIEF DESCRIPTION OF THE DRAWINGS

FIG. 3 is an enlarged view of the area in dotted circle labeled "Detail A" in FIG. 2C, showing jumpers of conductive polymer material made by a method according to an embodiment of the present invention.

DESCRIPTION OF THE PREFERRED EMBODIMENTS

Figure 1A:
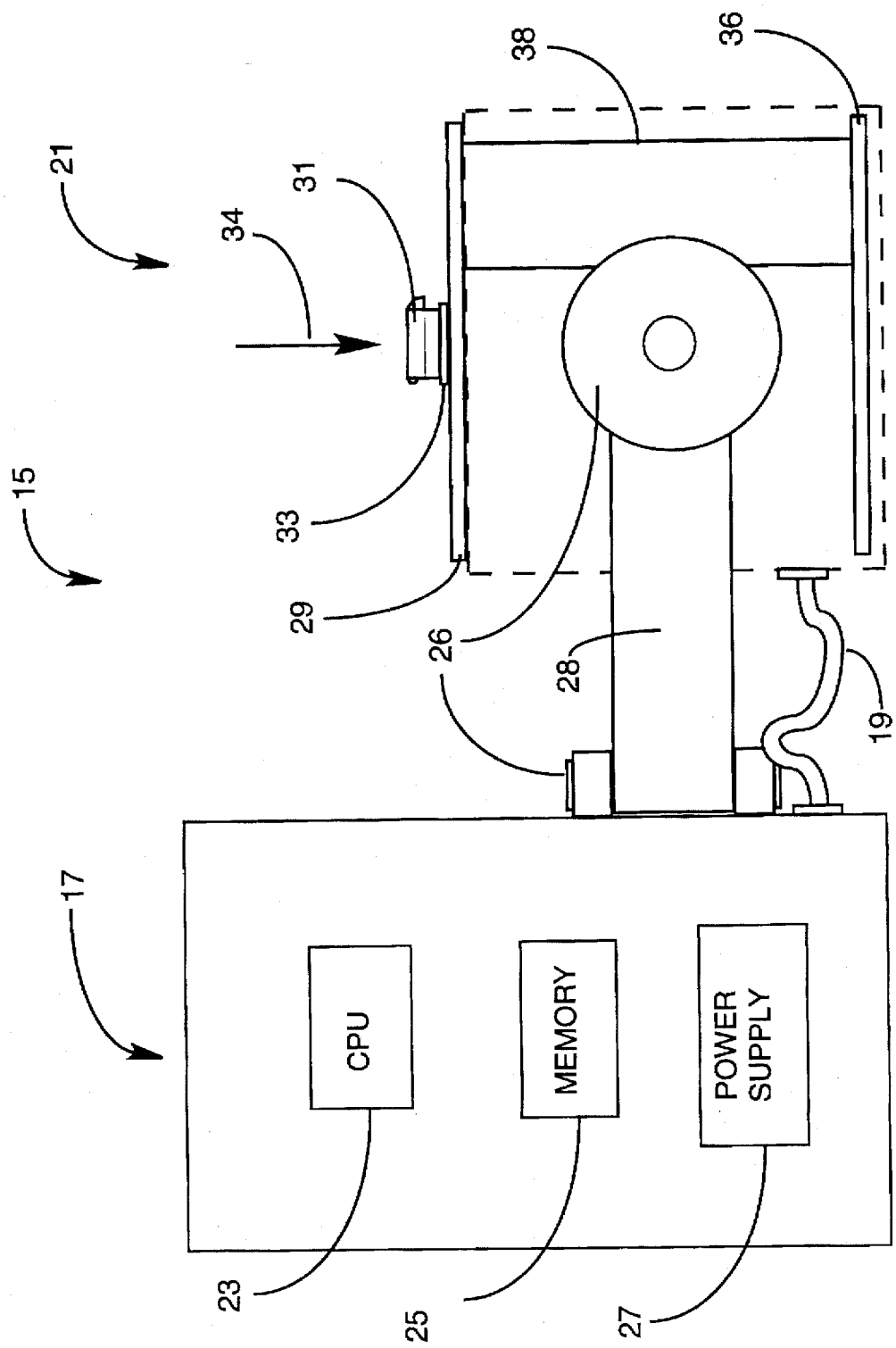
FIG. 1A, labeled prior art, is a representative illustration of a conventional IC test system 15 as known in the art.

FIG. 1A is a mostly block diagram of an IC test system 15 as known in the art. The system includes a computerized tester 17 connected by a cable bundle 19 to a test head 21. In actual systems there may be several cable bundles for the large number of conductors required from a tester to a test head.

Tester 17 generally comprises a computer processing unit (CPU) 23 for managing functions, a memory 25 for storing variable information and control routines, and power supplies 27 for supplying electrical power at appropriate voltage and current capacity to elements of the computerized tester, and also to test head 21. An interchangeable load board 29 is coupled to various conductors in cable bundle 19 from computerized tester 17 through mother board 36 and adapter boards 38 in test head 21. Load board 29, which is typically a multi-level board because of the large number of signals carried to a DUT for testing, serves as an interface to a socket 31 wherein a DUT is engaged for test. In conventional art, test head 21 is typically mounted on gimbals 26 and connected to computerized tester by bracket 28, or to a test stand, so test head 21 can be manipulated to allow test head 21 to mate with automated DUT loaders to facilitate IC testing.

There are various ways in the art that sockets are mounted to load boards in the type of test equipment described with reference to FIG. 1A. In some instances a socket may be mounted to the load board DUT test site, described in more detail below, by means of an intermediary receptacle 33, which is soldered to be semi-permanently mounted to the load board DUT test site; and has pins enabling sockets to be plugged into the receptacle and interchanged as necessary. In other instances, sockets are soldered directly to load board DUT test site.

Figure 1B:
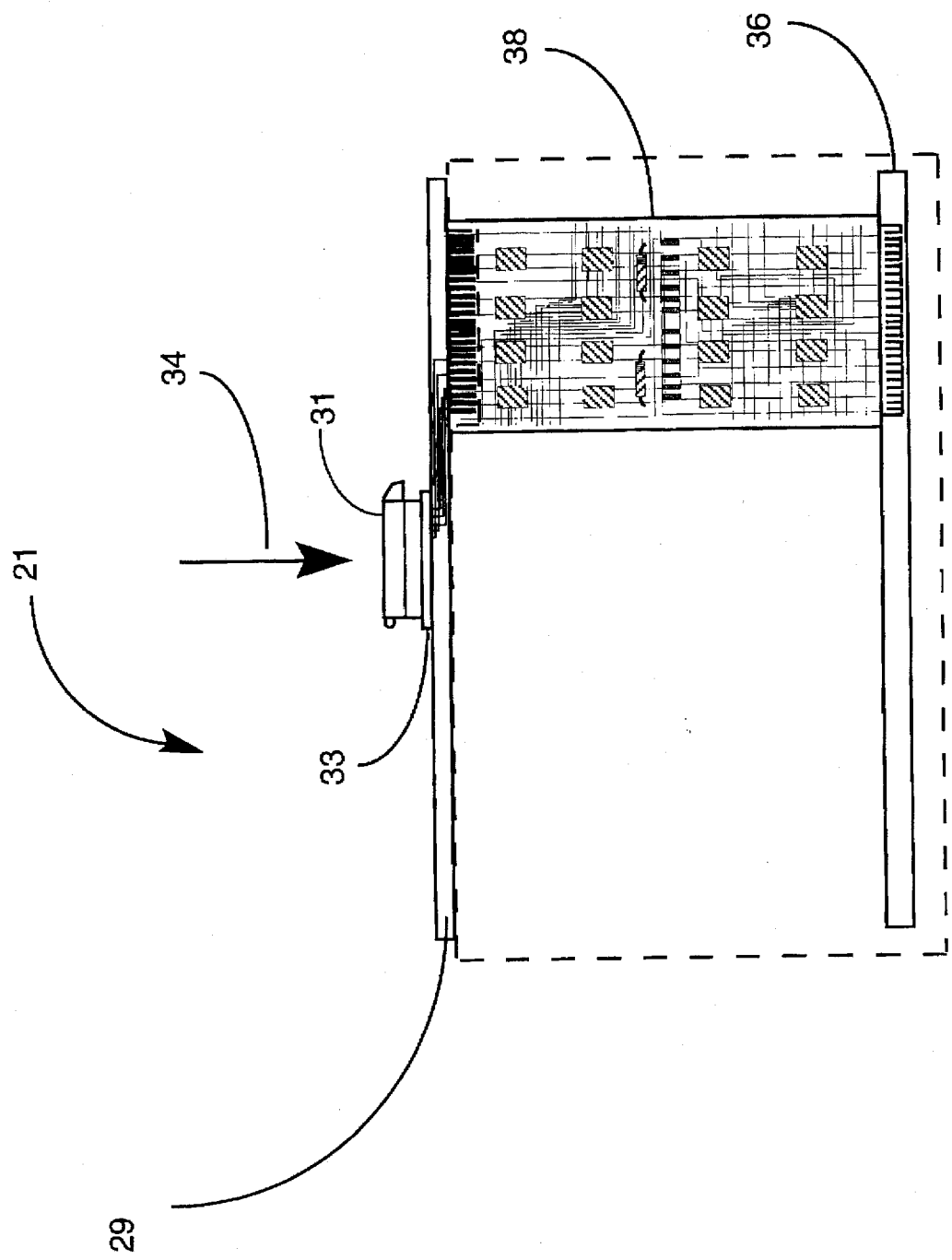
FIG. 1B, labeled prior art, is an illustration of a test head showing further detail.

FIG. 1B is a mostly block diagram showing more detail of test head 21, including a test head motherboard 36, which allows connection of test vectors to pin electronics cards 38.

The pin electronics cards condition and route test vectors to load board 29, which is a multi-layered module board connecting test vectors, power supply voltages and ground connections to DUT socket 31 through intermediary receptacle 33. Only one adapter board 38 is shown here for simplicity of illustration, but there are typically several such adapter boards configured similarly, to perform a variety of tasks in conditioning test signals and the like. Only one test head is shown, but several test heads may be connected to a computerized tester 17, depending on testing requirements.

Intermediary receptacle 33 is shown here as one way to connect DUT test socket 31 to a test area on load board 29. Other methods may include soldering DUT socket 31 directly to a DUT test site, eliminating the need for intermediary receptacle 33 but making DUT socket 31 replacement on a given load board 29 impractical and costly.

Figure 2A:
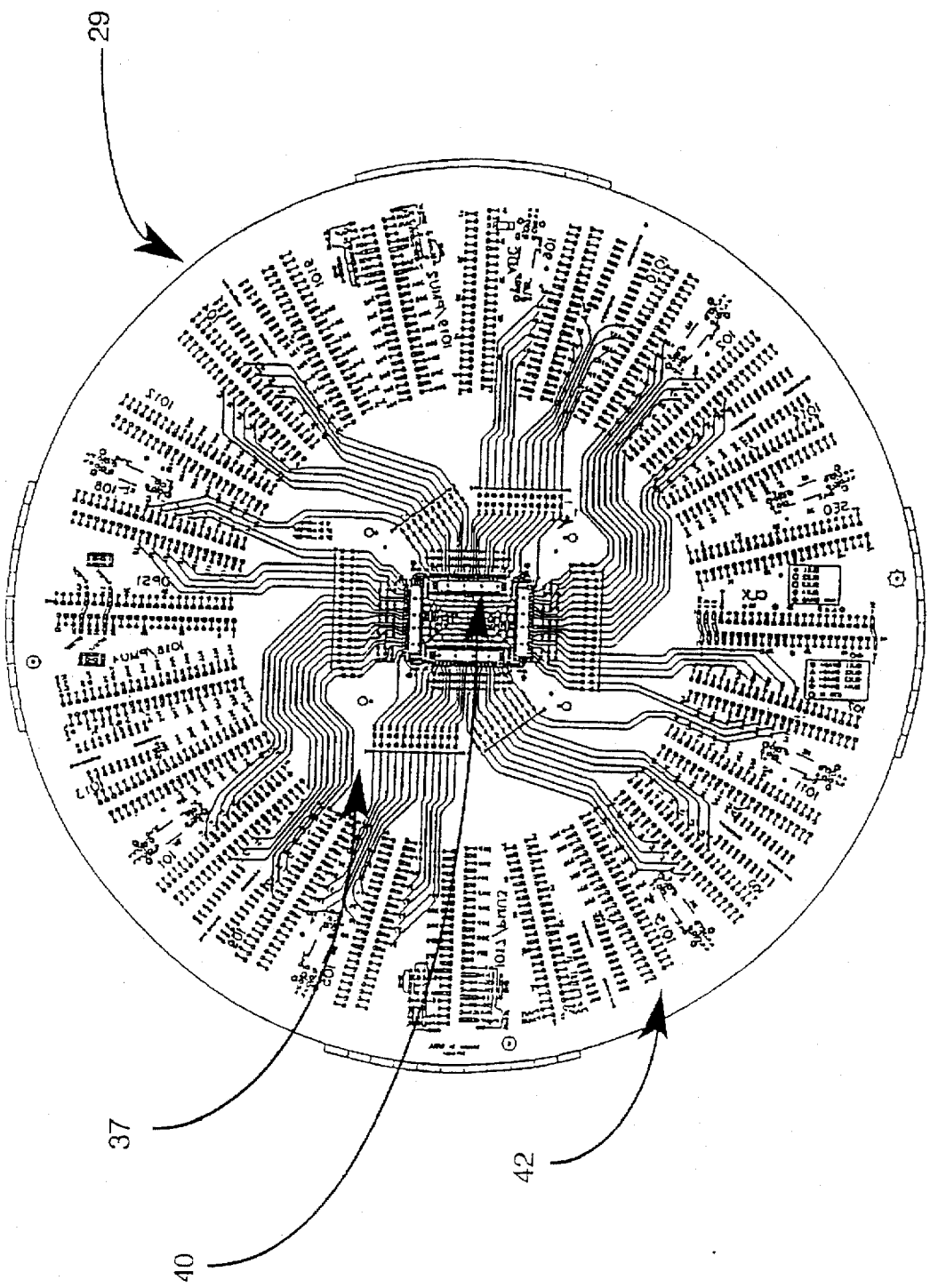
FIG. 2A, labeled prior art, is a plan view of a load board.

FIG. 2A is a plan view of load board 29, showing the opposite side, or underside, of the load board from the vantage point of arrow 34 in FIG. 1A and FIG. 1B. On this side of load board 29 there are typically contact points 42, to which pogo pins, or other means of connection well known in the art, interface with pin electronics boards 38 to establish power, ground, and vector signal connections to the rest of a test system 15 apparatus.

In center area 37 of board 29 there is a DUT test site 40, where through-holes are provided for engaging pins of either an intermediary receptacle or a test socket. As is well known to those with skill in the art, not all load boards are round, not all interface between a load board and a test head couple with pogo pins, and there are numerous alternatives to the typical and conventional apparatus and architecture shown here.

Figure 2B:
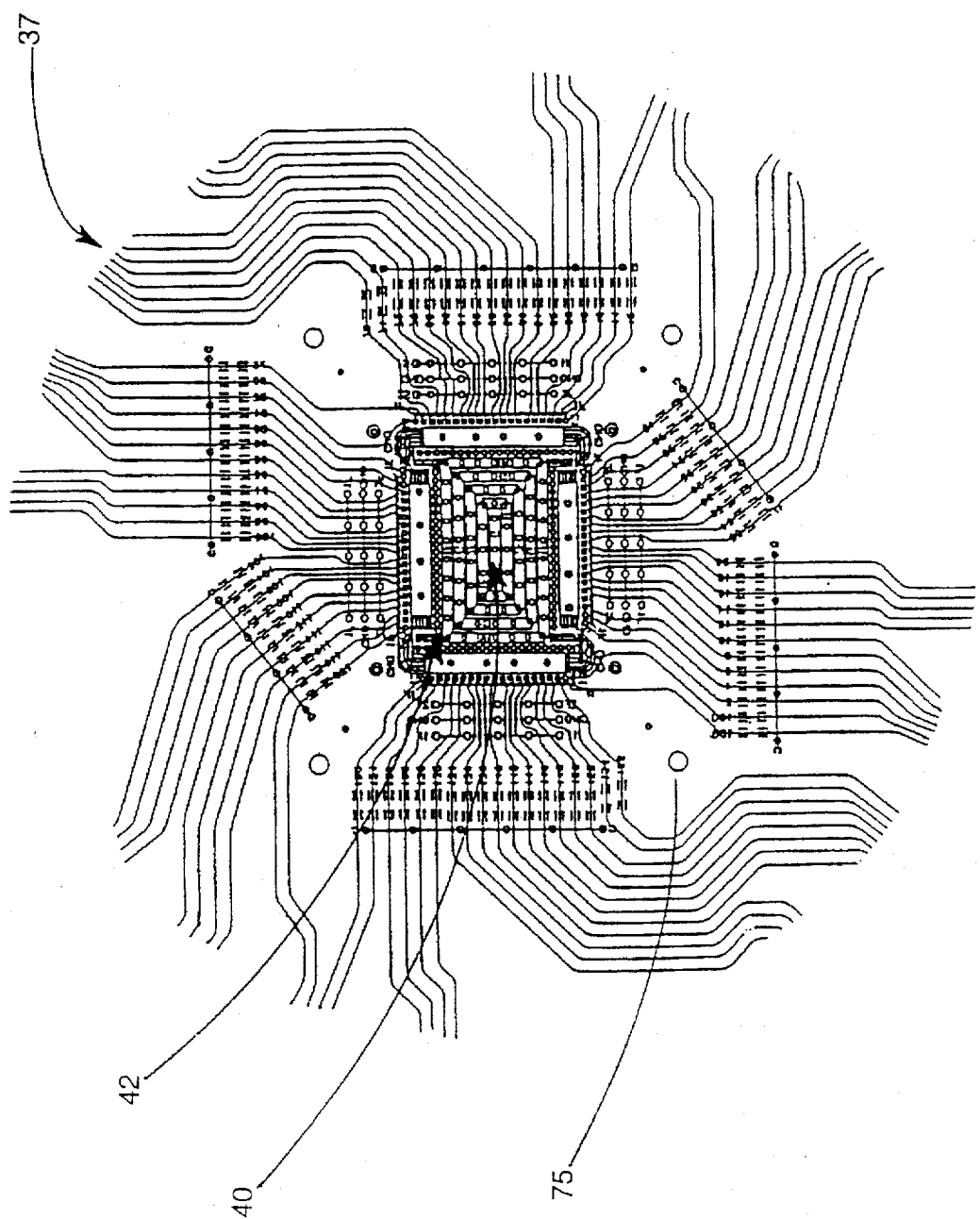
FIG. 2B, labeled prior art, is an enlarged plan view of the load board of FIG. 2A.

FIG. 2B is an enlarged plan view of a generally center area 37 of load board 29, which includes DUT test site 40. In this particular board fixture mounting holes 75 are provided as precision drilled holes which may be used for various purposes. In FIG. 2B, parallel rows 42 of plated through-holes are shown arranged in a rectangular pattern near the center of the board. It is generally to these plated through-holes that mounting pins of either a socket or a receptacle are engaged to the topside of load board 29.

The very large number of signal lines and other lines that must be brought to a DUT dictate the complexity shown, and it must also be remembered that, in many cases these are multi-level boards, wherein many signal lines, or power and or ground planes, are provided in the interior levels of the board. Six level boards, for example, are common in the art, and it is common to provide power and ground planes so a sufficient mass or cross-sectional area of conductor may be provided, considering the long distance from the power supplies in computerized tester 17 (FIG. 1A).

In the case of power and ground requirements, wherein the power and ground conductors typically originate in computerized tester 17, pass through test head 21 and through buried signal, voltage, and ground conductors and planes in load board 29, contact is brought to the surface of the board, as is well known in the art, by use of plated through-holes. Signal lines are typically, but not necessarily provided as traces on the outside layers of the load board. Termination on the load board for these signal lines is also typically at plated through-holes.

Figure 2C:
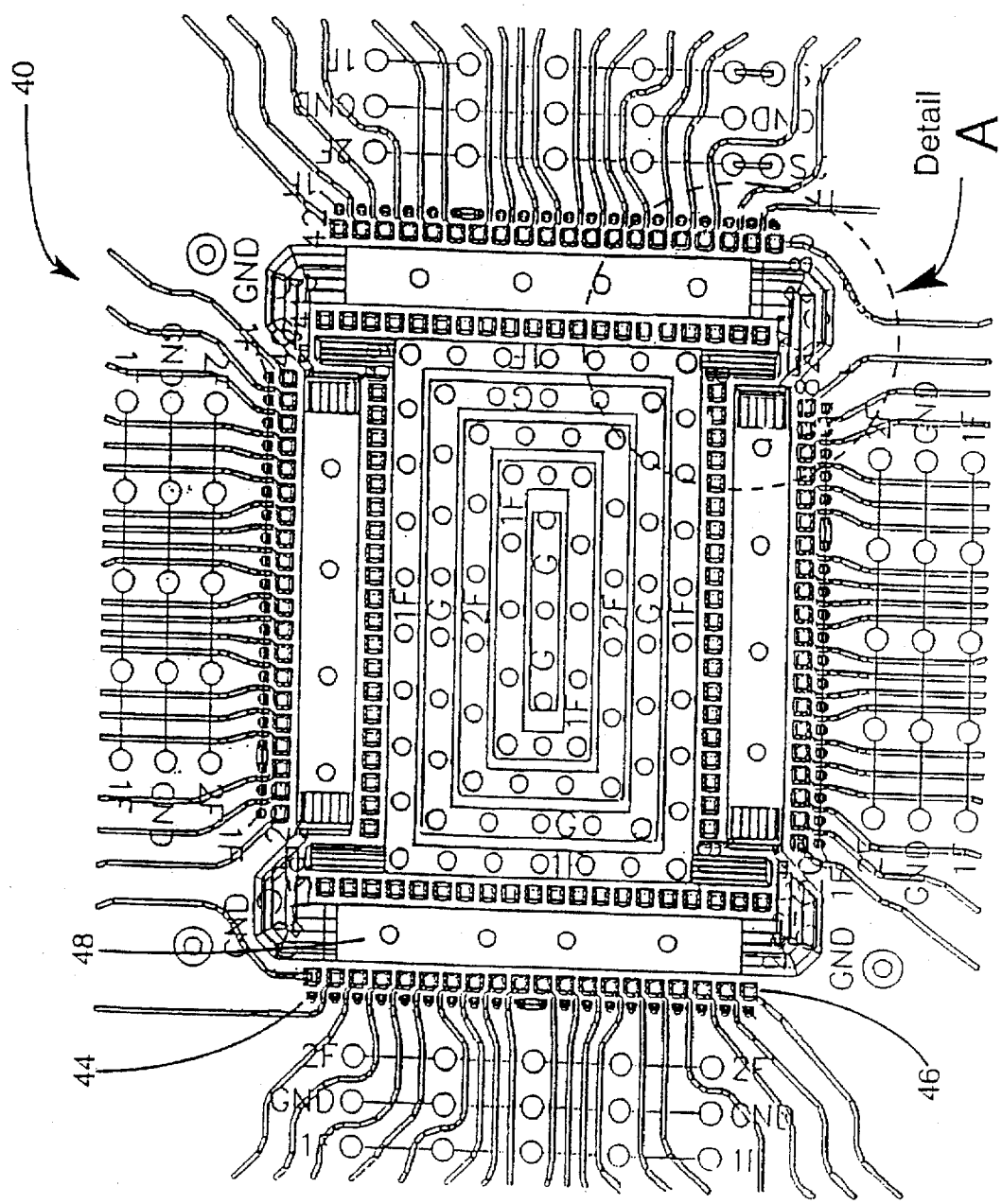
FIG. 2C, labeled prior art, is a further enlarged view of the load board of FIG. 2A and 2B.

FIG. 2C is a further enlarged plan view of test area 40 of load board 29, showing detail of DUT test site 40 where power supply and ground jumpers, not shown, are conventionally soldered to customize load board 29 to a unique DUT. Power supply voltages are typically connected from a test system 15 to plated through-holes and solder pads 44 in the same positions throughout a family of load boards 29, and are customized to different unique DUTs by installing jumpers, not shown, from through-holes that bring power to the surface to through-holes to which pins from a receptacle or a socket engage.

Ground connection is typically made to plated through-holes and solder pads 48 at the same positions throughout a family of load boards 29, and are customized to unique DUTs by soldering jumpers, not shown, from a ground position on plated through-holes and solder pads 48 to the proper DUT pinholes and solder pads 46.

There are problems, as described above, with manually soldering jumpers between DUT socket plated through-holes and solder pads and power supply and ground pinholes and solder pads. For example, jumpers and solder pads in a conventional apparatus are typically very small and closely spaced. There are a number of steps involved with each jumper connection in a conventional process. The conventional process is time consuming, tedious, and has a reasonable potential for bad solder joints that may need to be reworked, which increases the risk of damage to plated through-holes and solder pads.

FIG. 3 is an enlarged illustration of the area in dotted outline labeled Detail A in FIG. 2C, which shows jumpers formed of a conductive polymer material, applied in a process according to a preferred embodiment of the present invention. There are a number of suitable conductive polymer materials, such as Silver-Conductive No. 402 Resin, made by Adhesive Systems of Germantown Wisconsin, which, after being applied, have conductive properties similar to conductive metal jumpers as typically made in current art.

In making such jumpers, practicing the present invention involves use of a template, with openings for placing conductive polymer material at exactly the right position to make a jumper, either for power or for ground. A template in practicing the invention is configured for a unique DUT and more fully described below, and is secured firmly to cover DUT test site 40. A conductive polymer is applied over all template openings for conductive paths in a method more fully described below, and the template is shortly removed. Load board 29 is then processed, such as by heating, to cure the conductive polymer.

FIG. 3 shows conductive polymer jumpers 45A from power-connected plated through-holes 47 and 49 to the proper DUT socket plated through-holes with solder pads 50 and 52. Conductive polymer jumpers 45B connect from ground plane 48 to DUT plated through-holes and solder pads 54 and 58. The method of applying conductive epoxy for jumpers to load board 29 is accomplished more easily and less expensively than the conventional method of making soldered jumpers.

Figure 4A:
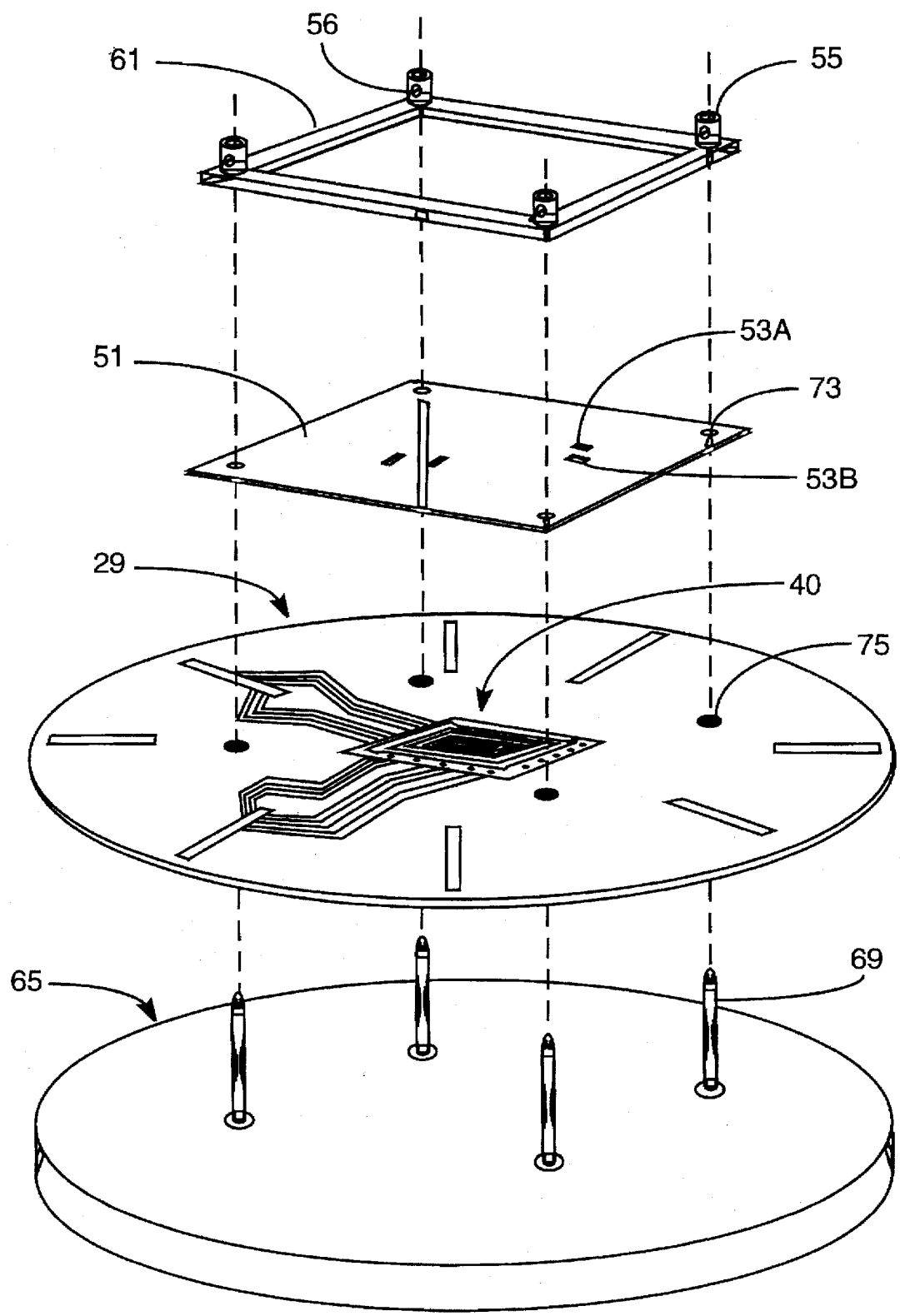
FIG. 4A is an exploded isometric view of a thick-film apparatus according to an embodiment of the present invention for applying conductive polymer jumpers to configure test system power supply and ground connections on a load board.

FIG. 4A is an exploded isometric view of an apparatus according to an embodiment of the present invention for applying conductive polymer jumpers to configure power and ground connections on a load board to match the requirements of a unique DUT socket. A template 51 is provided with openings 53A and 53B positioned precisely to make jumpers on load board 29. In addition to openings for making jumpers, template 51 also has alignment holes 73 for aligning the template to a load board, and openings 53A and 53B are positioned accurately relative to alignment holes 73.

Template 51 may be made of a variety of materials with consideration given to an ability to provide openings such as openings 53A and 53B with substantial accuracy relative to alignment holes, and to dimensional stability. Several plastic materials are suitable, such as polyethylene and others, and metals such as shim stock may also be used in some cases. The alignment holes and precision openings for making jumpers may be made in the template in any of several ways, such as by punching, laser machining, discharge machining, and the like, determined in part by the kind of material used for the template.

A frame 61 fits over and contacts all edges of template 51 to provide a firm contact between template 51 and DUT test site 40 so that openings 53A and 53B define precise volumes to define conductive jumpers. Load board 29, template 51, and frame 61 assemble on pins 69 engaged accurately in a fixture 65 to accurately and firmly position the elements to insure that conductive polymer jumpers are applied precisely.

Holding pins 69 pass through load board mounting holes 75, template alignment holes 73, and bushings 55, and the assembly is secured by set screws 56 in bushings 55.

Figure 4B:
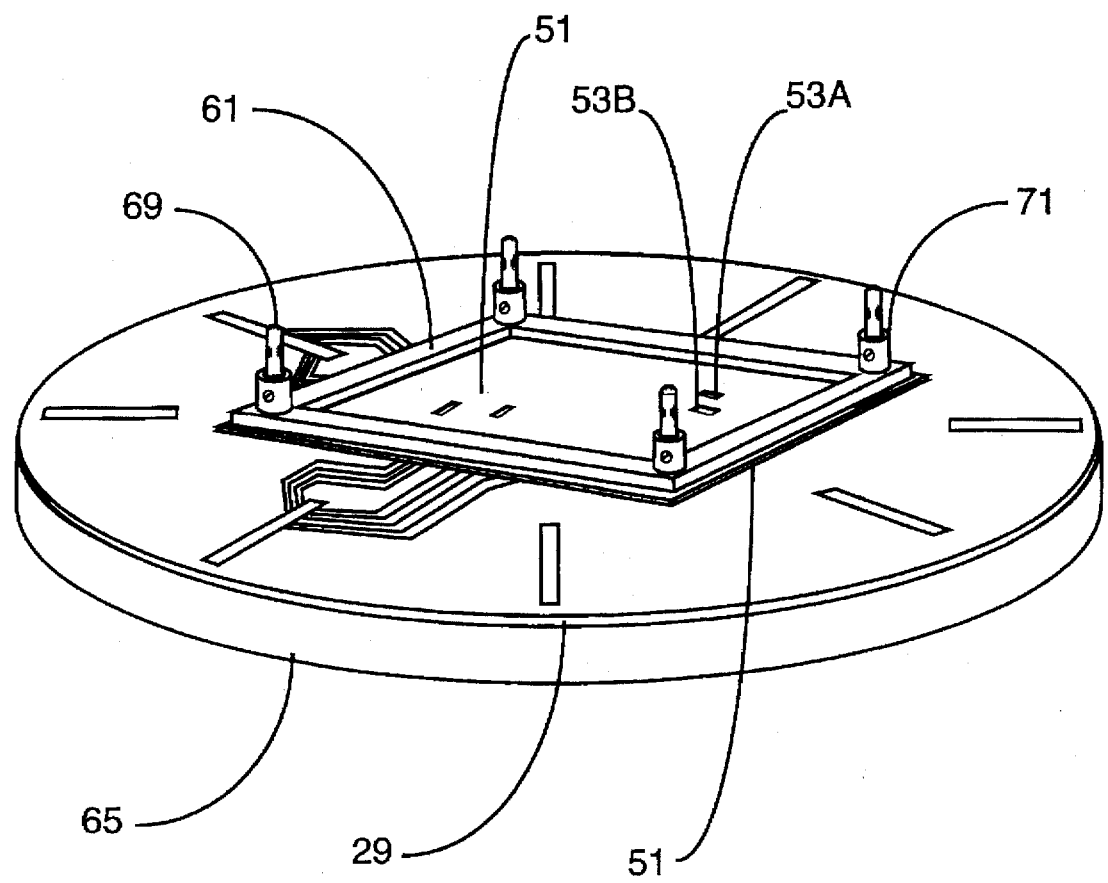
FIGS. 4B and 4C are isometric views of the exploded apparatus of FIG. 4A, assembled for practicing a methods according to embodiments of the present invention.
Figure 4C:
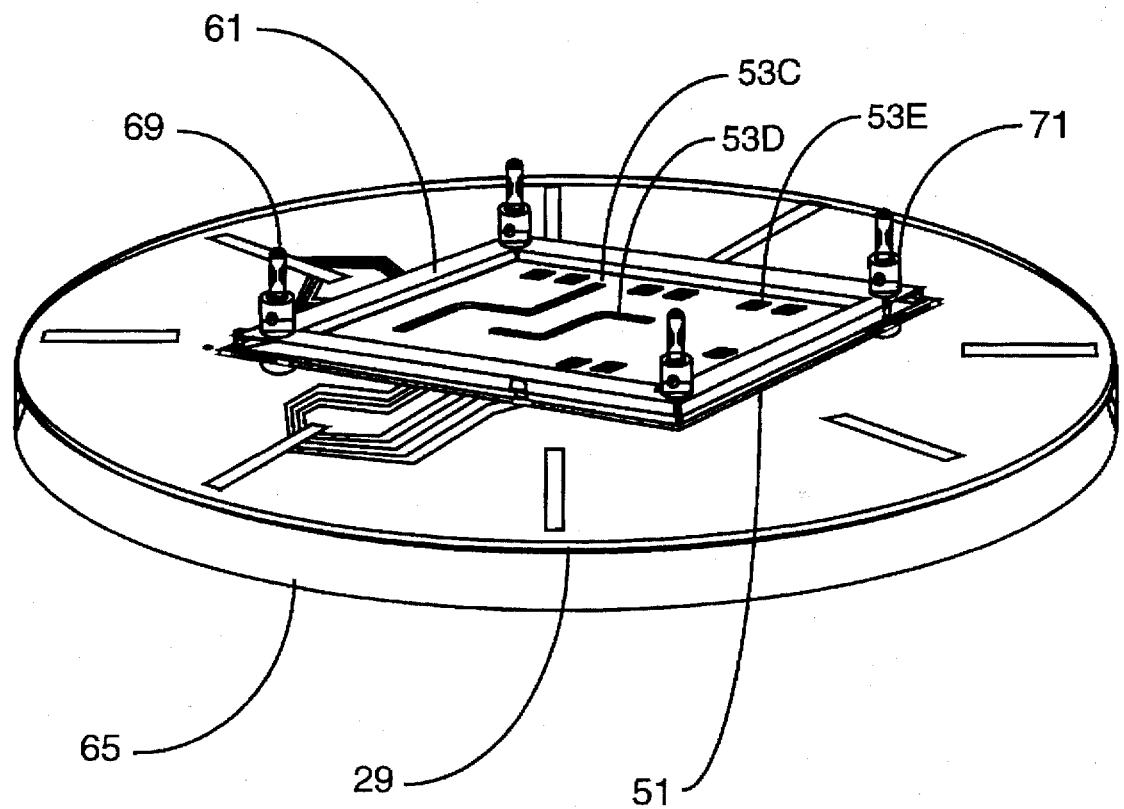

FIG. 4B is an isometric view of the apparatus of FIG. 4A fully assembled for making conductive polymer jumpers. Load board 29 is placed on load board fixture 65. Template 51 is placed on load board 29 covering test site 40. Holding frame 61 is placed over template 51. All the above elements are secured firmly by holding pins 69, bushings 55, and set screw 56. A conductive polymer is applied over, and worked into the template openings 53A and 53B in any convenient manner, such as by a sqeegie, to assure complete filling of openings and forming of the polymer jumpers. After applying conductive polymer jumpers, template 51 is removed from load board 29 and the load board is heated to facilitate curing of the polymer material.

In FIG. 3, jumpers are made on one side of the load board, in this case the underside of the board from the side where a receptacle or test socket is mounted. In some embodiments, however, jumpers may be made on either side or both sides of the board. For example, the ground jumpers for the board shown might be made on the underside, where a broad ground plane 48 is shown, and the power jumpers may be made on the topside of the board.

In the case of jumpers made on both sides of the board, the process according to the invention will be repeated on the opposite side of the board with a different template. Further, the board shown is but one example of many possible board designs. The locations of power through-holes 44 adjacent each of the pinholes 46 is convenient in the example described, but is not necessarily the case in all instances. A power plane on the topside of a board may, for example, be implemented similar to the ground plane shown on the bottom side of the board, and jumpers could be made from pinholes to the power plane on the topside.

In still another aspect, points to be connected on a board may be relatively remote, compared to the example described above. In some cases, then, openings in a template for practicing the present invention may be fashioned to provide conductive traces of some considerable length relative to the short jumpers shown. In the case of relatively remote points to be connected, the traces provided by filling opening in a template with conductive material while the template is maintained in an appropriate position, may be relatively complex, having one or more turns, rather than being simple straight lines. Such geometry in some embodiments may well be needed to avoid other features on a board to be processed.

It will be apparent to those with skill in the art that there are a variety of alterations that might be made in details of embodiments of the apparatus described above without departing from the spirit and scope of the invention. For example, there are many different types of conductive polymer that can be used instead of Silver-Conductive No. 402 Resin, as long as electrical conductive, adhesive, and other relevant physical characteristics make the material suitable for applying to a load board through a template. There are similarly many alterations in the apparatus that might be made within the spirit and scope of the invention. For example, there are equivalent ways the board and the template might be registered and secured to accomplish practicing the invention.

As an example of other securing methods, the template could be secured to the load board by such as tape over the edges of the template onto the load board, or a template with sticky-back material like "Post-it" memos might be used, which would make the template stick to the load board while applying a conductive polymer, and could then easily be peeled off after application. One might also use any of a number of latching devices with a holding frame, such as cam locks, wing nuts, or cotter keys.

A Smart Receptacle

The embodiments described above provide a quick and relatively inexpensive method for customizing a load board for IC test apparatus so power and ground connect to the appropriate leads of a DUT placed in a socket mounted on and connected to the load board. A customized load board according to the above descriptions and equivalents can be used with conventional receptacles and sockets in a test system.

In another aspect of the present invention, the inventor has provided a unique receptacle, termed by the inventor a Smart Receptacle, that allows decoupling capacitors to be coupled much closer to power leads of a DUT than has previously been possible. In some aspects of the invention this Smart Receptacle can be used with a load board customized according to a process of an embodiment of the present invention, and in other aspects the load board can be conventional, and full customization is accomplished by the receptacle instead of by forming finishing jumpers on the load board.

Figure 5:
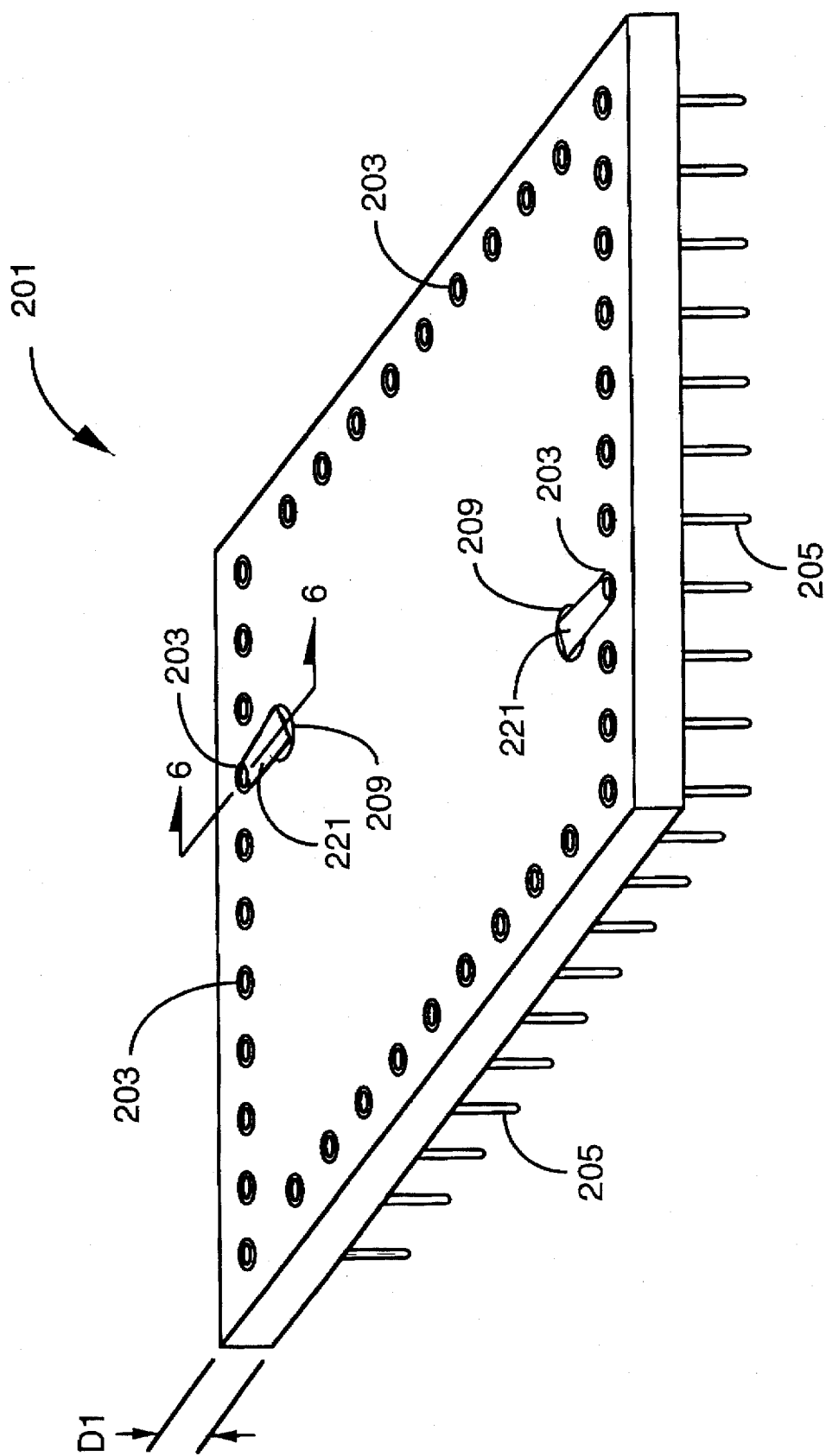
FIG. 5 is an isometric view of a Smart Receptacle according to an embodiment of the present invention.

FIG. 5 is an isometric view of a Smart Receptacle 201 according to one embodiment of the present invention. As is known in the art, a receptacle is typically provided to adapt a test socket to a load board in a manner that allows the test socket to be interchangeable. The plated through-holes in a load board are not generally suitable for simply engaging the pins of a test socket without soldering the test socket pins into the plated through-holes. Direct connection of a test socket to a load board then, provides an assembly wherein the test socket is not easily removable to be interchangeable with other sockets.

Pins are provided on receptacles for engaging plated through-holes in a load board, and soldering to the plated through-holes. These pins generally relate on a one-to-one basis with leads of a socket, and may be in any one of several well-known patterns. Each pin connects to a socket aperture which extends through generally the thickness of the receptacle. Each of these socket apertures, as they are termed in this disclosure, is a female hollow pin configured to receive a male pin from a socket, and to make efficient electrical contact by friction.

In Smart Receptacle 201 of FIG. 5, each of pins 205 connects to a socket aperture 203 which extends through thickness D1 of Smart Receptacle 201. This much of the structure of the Smart Receptacle is conventional, and serves the same purpose as the equivalent structure of a conventional receptacle.

In the case of leads of a DUT that require power, as was described above in the Background section, due to multiple junctures and often necessarily small cross-section of conductive paths for power from a power supply to final connection to leads of a DUT, it has become a practice to provide load capacitors near the lead connection, with one end of the capacitor connected as close as is practical to a lead requiring power, and the other connected to ground. These load capacitors are typically and conventionally mounted between plated through-holes and a ground plane on the backside of a load board; that is, the side opposite side where a receptacle and a test socket are mounted.

In Smart Receptacle 201, extra holes 209 are provided preferably adjacent to those pins requiring power, and a decoupling capacitor is placed in each hole 209. The diameter of holes 209 and the thickness D1 of the Smart Receptacle is made to accommodate the full length of the decoupling capacitors to be used. Available sizes of these capacitors is well known in the art. For example, one popular decoupling capacitor is about 0.060 inches in diameter and about 0.125 inches long. For this capacitor, a hole 209 would be provided somewhat greater in diameter than 0.060 inches, and the receptacle board would be made to a thickness D1 of about 0.125 inches.

In a preferred embodiment of the invention, the Smart Receptacle is made as a printed circuit board, for reasons that are made clear by disclosure below printed circuit board material and construction, however, is convenient, and not strictly required. There are other ways that Smart Receptacles according to the invention may be made.

Finally relative to FIG. 5, although it is not seen in FIG. 5, there is a ground plane (copper area) implemented on the underside of the Smart Receptacle. The purpose of the ground plane is primarily to provide grounding for decoupling capacitors mounted through the Smart Receptacle. Also, holes 209 can be provided in more than one way.

In one embodiment, a pattern of holes 209 capable of mounting a decoupling capacitor is provided such that one hole 209 is available near each socket aperture 203. Because of the generally larger diameter of holes 209 than socket apertures 203, there are, in this embodiment, fewer holes 209 than there are socket apertures 203. A hole 209, for example, may be provided adjacent to each second aperture 203. Such a hole 209 may then serve either the immediately adjacent aperture 203 or the aperture immediately to either side.

In an alternative embodiment, holes 209 are drilled or otherwise fabricated after it is determined which apertures 203 are to be tied to power. Then one hole 209 is made for each aperture 203 needing power connection.

Figure 6:
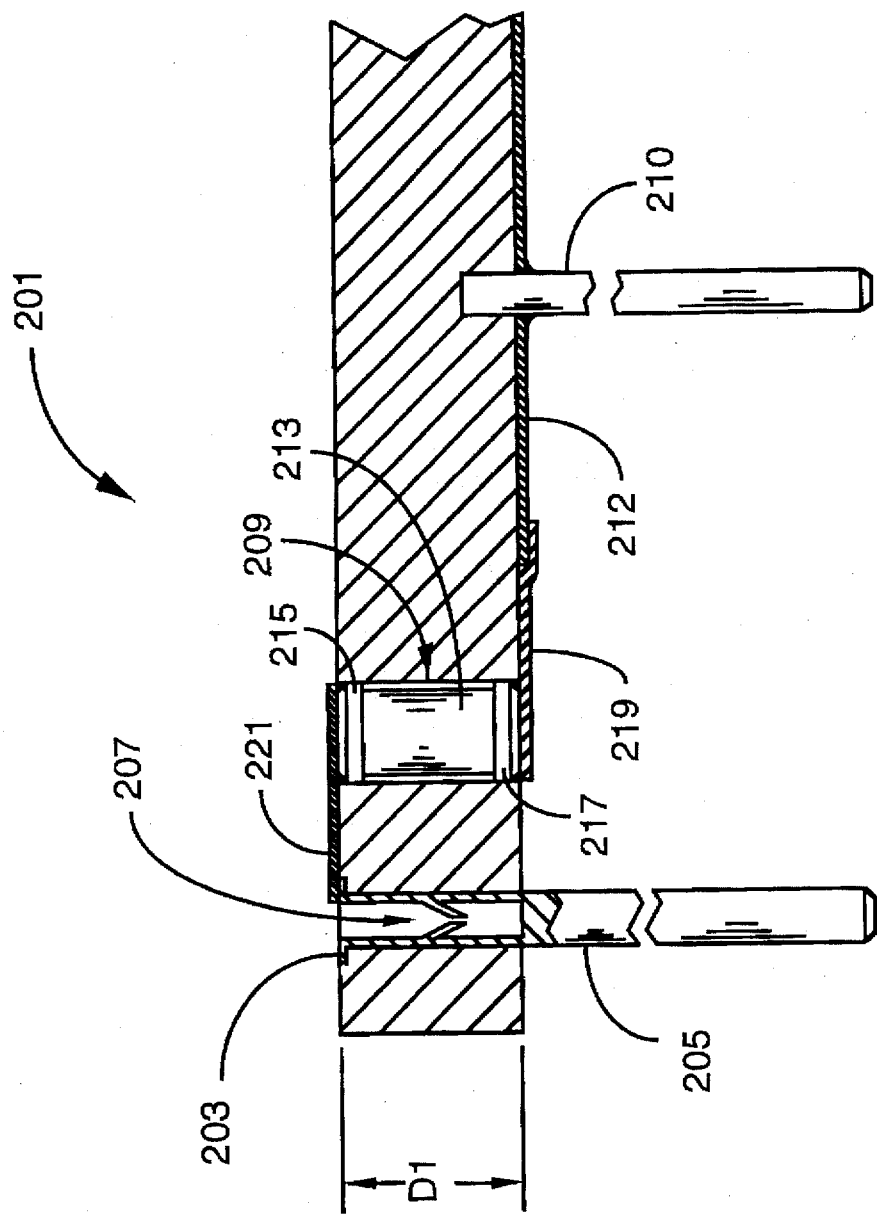
FIG. 6 is a partial cross section of the Smart Receptacle of FIG. 5 taken along section line 6—6 of FIG. 5.

FIG. 6 is a partial cross section of Smart Receptacle 201 taken along section line 6—6 to show the special nature of the socket apertures, pins, and location of decoupling capacitors in holes 209. Socket aperture 203 has a resilient conical structure 207 which assures that pins from a test socket may be engaged by friction alone while providing intimate electrical contact. This structure of pins 205 and socket apertures 203 is well-known in the art.

In the Smart Receptacle according to the embodiment of FIG. 6, extra pins such as pin 210, are provided to bring ground from the load board to a ground plane 212 on the underside of the Smart Receptacle. There are, for a Smart Receptacle according to embodiments of the invention, typically more than one such ground pin, so the ground plane provided is a hearty ground connection.

In FIG. 5, two socket apertures 203 are assumed, for purposes of illustrating this embodiment of the invention, to require power. A single through-hole 209 is shown near each of the socket apertures 203 requiring power, although them may be more holes 209, as described above. A decoupling capacitor 213, which has conductive bands 215 and 217 at the ends, is inserted in through-hole 209.

To connect decoupling capacitor 213 to socket aperture 203 and to ground plane 212, a jumper 219 is provided to ground plane 212 on the underside, and a jumper 221 is provided to the adjacent socket aperture 203 on the top side. The power connection of cap 213 is thus made at the top side of Smart Receptacle 201 rather than at the underside of the load board, closer to the power lead of a DUT by about 0.5 inches, which is a significant improvement over the prior art. The ground connection is made to a robust ground plane on the back of the Smart Receptacle.

In addition to ground jumpers for decoupling capacitors, those pins requiring ground connection may optionally be jumpered on the underside of Smart Receptacle 201 to ground plane 212 rather than being jumpered on load board 129 as previously described.

Jumpers 219 and 221 for Smart Receptacle 201 may be made in a number of ways, just as load boards are customized by jumpers in a number of ways, such as by hand soldering the connections or soldering wires between the connection points. In a preferred embodiment, however, an unfinished Smart Receptacle is placed on a holding fixture, a template is registered to the same fixture, and the jumpers are made by urging conductive polymer into openings in the template strategically placed to make the jumpers. The apparatus and procedure in this embodiment is very similar to that described above for customized load boards with reference to FIGS. 4A and 4B.

The Smart Receptacle in the embodiment shown in FIGS. 5 and 6 is preferably used with customized load boards of the type described above, wherein jumpers to power and ground are made by applying conductive epoxy with a template. Such a Smart Receptacle, however, may also be used independently, with load boards that are fully customized in the PCB manufacturing process, or customized by solder or wire jumpering on a more generic board.

Figure 7:
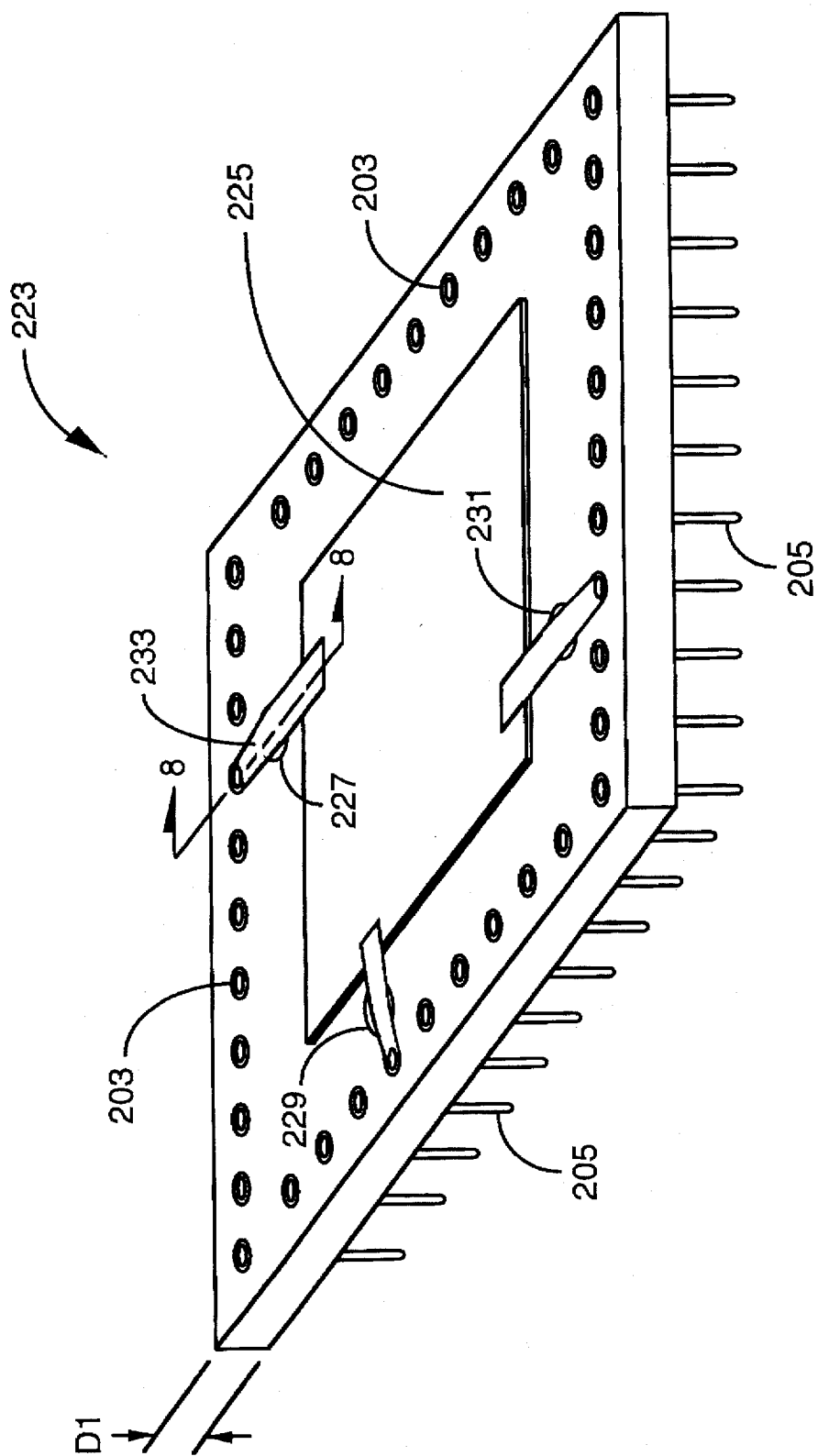
FIG. 7 is an isometric view of a Smart Receptacle according to another embodiment of the present invention.

In an alternative embodiment a Smart Receptacle 223 is shown in FIG. 7 having a power plane 225 on the top side of the Smart Receptacle 223, and connected to power via extra pins through the thickness of Smart Receptacle 223 (not shown in FIG. 7, which power pins connect to through-holes provided in the load board that are connected to the power plane of the load board. In this embodiment, for illustration, three leads are assumed to require power. Decoupling capacitor holes 227, 229, and 231 are provided adjacent to the socket apertures 203 for these power leads, between the socket apertures 203 and the power plane 225.

Figure 8:
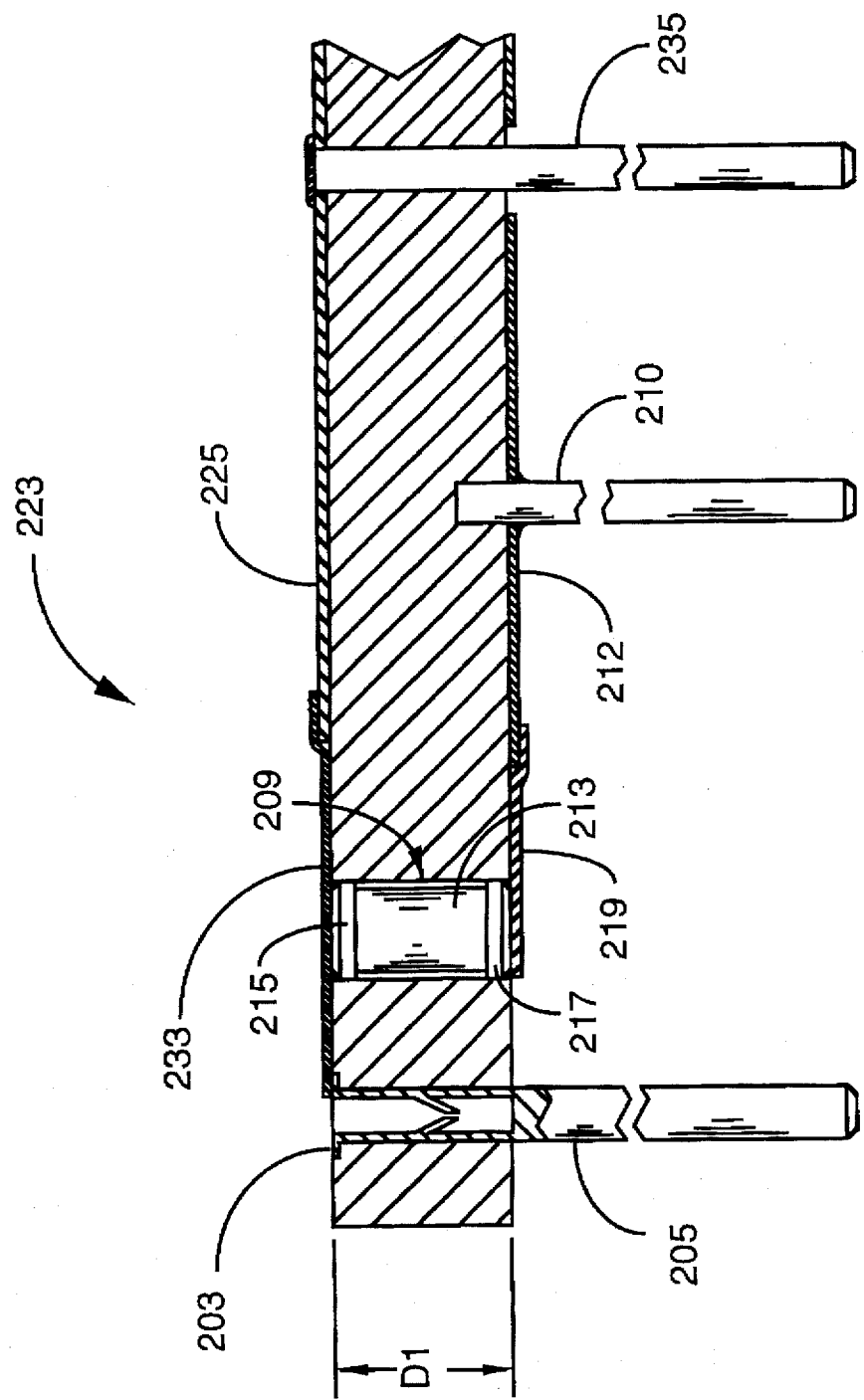
FIG. 8 is a partial section elevation view of the Smart Receptacle of FIG. 7 taken along section line 8—8 of FIG. 7.

FIG. 8 is a cross section of Smart Receptacle 223 of FIG. 7 taken along section line 8—8 of FIG. 7. Elements and dimensions common to the structure of FIG. 6 are given common element numbers for convenience. For example, pins 205 connect to socket apertures 203 as in Smart Receptacle 201 (FIG. 6). Also, jumpers 209, preferably made by the thick-film template technique of the present invention, connect from ground plane 212 to one end of decoupling capacitors 213 in holes such as hole 227 shown.

Power plane 225 connects to power pins on load board 129 (not seen in FIG. 8) by pins 235 which pass through the thickness of Smart Receptacle 223 at positions where ground plane 212 has an opening. There may be several pin connections for power plane 225, to assure a robust power plane.

In Smart Receptacle 223 jumpers 233 are made from apertures 203 across one end of decoupling capacitors 213 and further to power plane 225. These jumpers may be made by conventional processes, or they may be made by the thick-film technique of the present invention with a template. Additionally, ground only jumpers for apertures 203 requiring ground connection are made by jumpers on the underside of Smart Receptacle 223 between pins 205 and ground plane 212. These jumpers may also be made conventionally, or preferably by the thick-film technique of the present invention.

A smart receptacle according to various embodiments of the present invention, then, may provide no customizing function, and the load board is customized completely, or may provide a part of or all of the customization function. By providing ground-only jumpers, a Smart Receptacle provides a portion of the customizing function, and by having a power plane and a ground plane, and jumpering to appropriate pins (apertures), all of the needed customization may be done on the Smart Receptacle. In this case, a generic load board may be provided for many types of ICs having common pin geometry.

As was described above for Smart Receptacle 201, Smart Receptacle 223 may also be designed such that jumpers required may be relatively long and complex, like traces on a printed circuit board. Such traces are achievable by the thick-film technique of the present invention.

In test systems like those described above, both conventionally and according to preferred embodiments of the present invention, there are lines other than power, ground, and signals to a socket. These are Sense lines, which are provided to monitor voltages at power and ground points near the leads (if possible) od a DUT. In a further embodiment of the present invention, sense lines for power and ground are brought to the Smart Receptacle and connected to the power and ground planes of the receptacle, thus bringing sensing closer to the DUT than is possible in current art.

A Vacuum-Retained Load Board

FIG. 2A, as described above, is a plan view of one side of a load board as known in the art. Referring to FIG. 1B, this is the underside of a load board, opposite the direction of arrow 34 in FIG. 1B. On this side of the load board there are numerous contact pads for interfacing to pin electronics cards, such as card 38 shown in FIG. 1B. Such pin electronics cards are typically arranged around the entire circumference of a load board when assembled to a test head. The number of pin electronics cards in different setups varies of course, but 50 or more such cards is typical, and each card may have a dozen or more pogo pins contacting pads on a load board.

Because each pogo pin, having a spring-loaded contact pin, exerts a force of perhaps two ounces when compressed, the total loading of a board to depress all pogo pins can be considerable. For example, 100 cards each having 12 pins providing 2 oz. thrust is about 150 pounds.

Referring to FIG. 1A, as well as to FIG. 1B, it is apparent that a secure fastening method and apparatus is needed to mount a load board to a test head against the resistance of the numerous pogo pins. It is also desirable that the means of mounting be relatively simple so load boards may be readily and reliably interchanged.

Secure mounting of load boards to test heads has been done in several ways in the art, mostly mechanical. A common apparatus, for example, comprises a cam collar and a locking ring, wherein the locking ring exerts downward pressure on a load board by rotating the cam collar, much as would be the case with a large diameter screw thread. In other known apparatus standard nuts and bolts are used.

One problem with mechanical fastening is that the area of applying pressure is somewhat restricted, mostly around the outer periphery of a load board, and there has been no good way to apply pressure more evenly over a board. Another problem is that mechanical fastening is necessarily relatively cumbersome.

In a recent improvement in load board mounting, test heads have been fitted with concentric o-rings, and a partial vacuum has been applied within a test head, so a load board may be urged against pogo pins and seated by differential pressure over the area of such a board between the concentric o-rings. O-rings in this application are a matter of convenience, and other sons of resilient vacuum seals for engaging a surface of a load board may be used.

Figure 9:
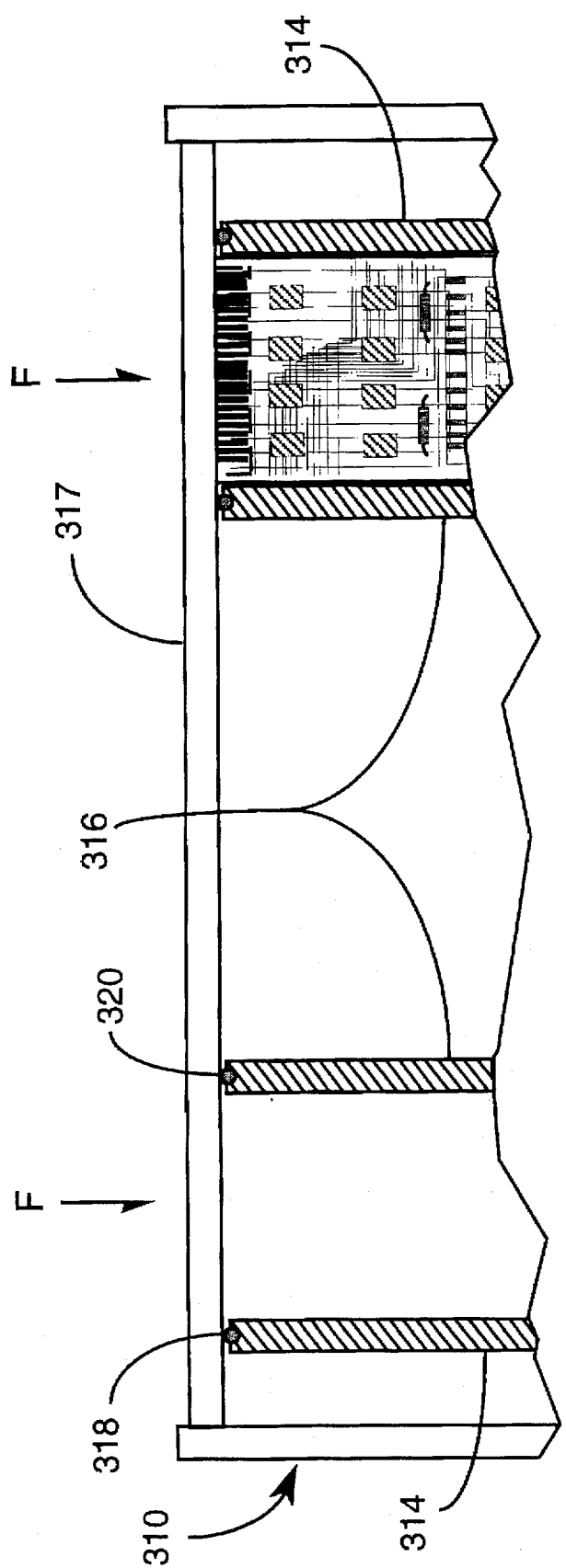
FIG. 9 is a cross section showing a vacuum-style test head.

FIG. 9 is a partial simplified cross section of a test head 310 provided for vacuum mounting of a load board 317, wherein the load board is adapted for differential pressure mounting. In FIG. 9 a cylinder 314 within the test head has an o-ring 318 mounted at the upper end, and a smaller diameter cylinder 316 within cylinder 314 has an o-ring 320 mounted also at the upper end. A vacuum pumping apparatus not shown in FIG. 9 is utilized to maintain a partial vacuum in the toroidal volume defined between cylinders 314 and 316, such that a load board 317 placed over the o-rings as shown will be urged toward the test head and held in place by differential pressure as a result of the partial vacuum maintained in the toroidal volume.

As is shown in FIG. 9. pin electronics cards in this mounting scheme are within the vacuum volume. The differential pressure that urges the load board toward the test head depresses the pogo pins of the pin electronics cards against pogo pin pads on the underside of the load board.

Consider as an example, a load board of 11 inches outside diameter seating on an o-ring set wherein the outer o-ring is of 10 inches diameter and the inner is of 6 inches diameter. The pressure area in this example is the area between the two o-rings, and may be shown by simple geometry to be about 50 square inches. If the partial vacuum is 0.3 atmosphere, the pressure differential will be about 4.5 psi. The total differential force will be over 225 pounds, more than enough to firmly seat the load board against the o-rings, and the pressure will be applied evenly over the board in the area where the pogo pins make contact. This is a desirable situation.

Of course, if pressure differential is to hold a load board, the board can have no holes all the way through the board. If there are such through-holes, the pressure differential will be lessened, lessening the holding force, and the force may not be adequate. Moreover, if there are such holes, air will be pulled into the interior of the test head in the vacuum area, and a vacuum pump may overload and overheat, as pumping high volumes of air involves compression of the air and attendant buildup of heat.

Unfortunately, there are numerous thorough-holes in conventional load boards. Every pogo pin pad typically is connected by an electrically conductive trace, for example, to an adjacent plated through-hole, so engineers and operators may test electrical integrity from the outside, that is, the upper side of the board from where the pogo pins make contact inside the test head on the underside of the load board.

Plated through-holes connected to pogo pin pads are not the only through-holes in load boards; there may be others; but the pogo pin test holes are typically the majority of such holes. For a load board to be useful for mounting in a vacuum chuck as described above, then, the through-holes must somehow be covered.

At the time of the present invention, a typical process for plugging through-holes is by an extra coating of dry-film solder mask material, which is a material and a process well known in the art.

Figure 10:
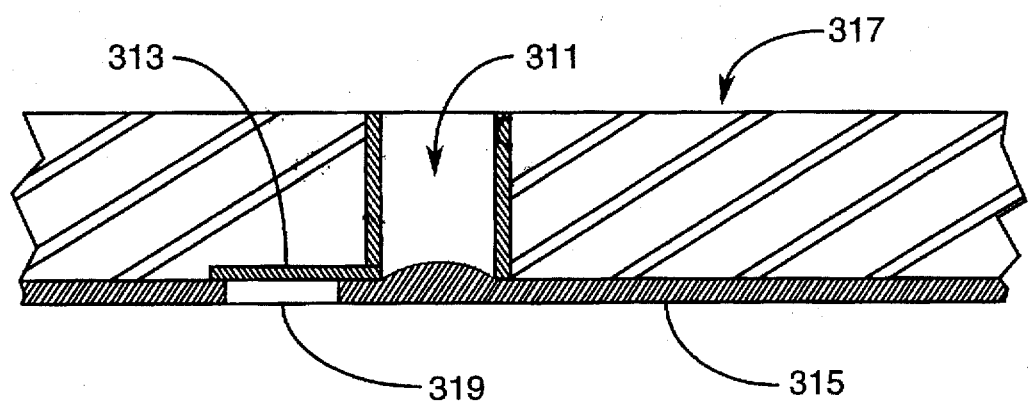
FIG. 10 is a partial cross section through a single through-hole of a load board adjacent a pogo pin pad, with solder mask material applied to plug the hole.

FIG. 10 is a partial cross section of a single plated through-hole 311 adjacent to a pogo pin pad 313 on the underside of load board 317 adapted for use with a vacuum chuck. A layer 315 of dry-film solder mask material has been applied and processed, so that through-hole 311 is plugged on the pogo pin side, but through-hole 311 is still open at the opposite end from layer 315, that is the topside, or outside. A user can, in this arrangement, still insert a probe for such as an oscilloscope from the open side, and test the electrical state of the pogo pin pad, while the hole is still plugged for the purpose of the vacuum chuck by which the board is to be mounted to a test head. Notice that area 319 of the pogo pin pad is not coated, so pogo pins from pin electronics boards may still make electrical contact.

This conventional method of closing holes has had some success in the art, but also has some serious drawbacks. For example, the solder mask material does not exhibit high strength, and is relatively brittle. In tests, a force was exerted by a probe against the solder mask material through a through-hole. The force necessary to punch through the solder mask material was about 2 oz. In practice, accidents with probes, and just the application of the differential pressure, in some cases, has broken solder mask closure of through-holes. Brittle solder mask material flaking into a test head and possibly being drawn into a vacuum pump can be a serious problem.

Figure 11:
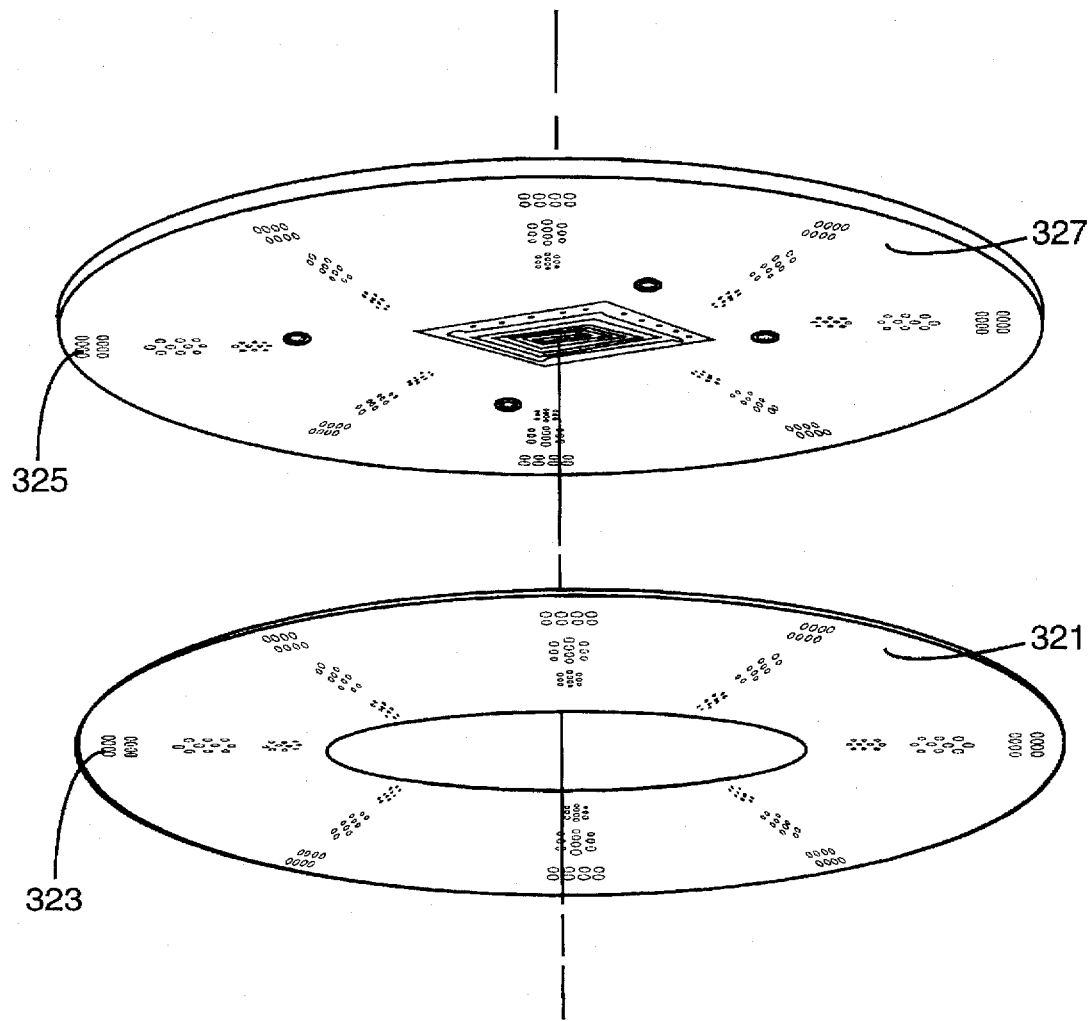
FIG. 11 is an exploded view illustrating a load board and a plastic sheet for stopping holes in the load board.

FIG. 11 is an exploded view of a conventional load board 327 and an especially prepared sheet 321 of Mylar™ material for closing holes, according to an embodiment of the present invention. In this embodiment openings, such as opening 323 are provided in the Mylar™ material in the pattern of pogo pin pads 325 on load board 327. The Mylar™ material is positioned to the underside of load board 327, and applied thereto by an adhesive material in an embodiment of the present invention.

In some embodiments, an adhesive material is applied to one side of a Mylar™ sheet prepared for a load board by spraying. In other embodiments Mylar™ having a precoated adhesive is purchased and fashioned with the needed outside and inside shape and the pattern of openings needed for pogo pin contact. Such plastic sheets can be purchased having an adhesive and a peel-off protective plastic or paper sheet overlying the plastic. In this case, the holes are punched or otherwise prepared, the shape of the sheet is cut, then the protective paper is removed and the plastic sheet is applied to the load board.

There are other materials than Mylar™ that are suitable for applying in a sheet to the underside of a load board to stop through-holes according to embodiments of the present invention. Several kinds of plastic sheets may be used, and, in some cases, even strong paper is a better material than solder mask material.

In the process of preparing and mounting a sheet material to a load board, the sheet must be cut to size, and appropriate openings (holes) made so that, when the sheet is mounted the openings (holes) will expose the pogo-pin pads and any other area of the load board that is required to be exposed in use. There are a number of ways this may be done. In the matter of fashioning the holes for exposing pads and the like, computer files prepared for fashioning the board itself may be used to prepare such as numerical control (NC) programs for machining plastic sheets, either singly or in layered groups, to form the necessary openings. There are less automatic ways as well, as will be evident to those with skill in the art.

In the matter of mounting the sheets to load boards, it is necessary that the sheets be registered with sufficient accuracy that the openings in the sheets expose the pads, such as pogo pin pads. This can be done by use of a fixture prepared for the purpose, wherein a load board to be processed is registered to the fixture, such as within pins that define the outer diameter of the board. Then the sheet to close the through-holes in the board is registered to the same fixture, so the board and the sheet become properly aligned.

With a sheet of material applied according to the present invention as described above, the low strength problem of solder mask material is overcome. In tests, punching through a sheet of Mylar™ or Kapton™ material by a probe through a closed-off through-hole requires a force of about 2 pounds, sometimes, more, depending on the nature of the probe. A sharp probe punches through with less effort than a blunt probe. In any case, the force is orders of magnitude greater than the force needed to punch through a solder mask material. The net result of the invention is a safer and more reliable load board for use with vacuum-chuck apparatus for mounting load boards in test systems.

It will be apparent to those with skill in the art that there are many alterations that may be made in the embodiments of the invention described herein without departing from the spirit and scope of the invention. For example, there are many alternatives for materials in the form of sheets that are suitable for applying to load boards to close through-holes according to embodiments of the present invention. Trademarked and readily available sheet materials are mentioned above. Many other sorts of plastic sheets may also be used. In some cases, heavy paper materials may also be substituted. The material is to some extent a matter of convenience, but, in a general sense, must be of a cohesion and strength to be prepared in a sheet form and hold its dimensional integrity and form without being supported by a load board or other surface.

There are, as will be apparent to those with skill in the art, many other variations that might be made in apparatus and methods described without departing from the spirit and scope of the invention. A wide variety of adhesives may be used, and a wide variety of film materials suitable for the purpose of various embodiments of the present invention are available with adhesive already in place, and protected, in many instances, by peel-off protective film.

What is claimed is:

1. A load board for vacuum-chuck mounting to a test head of an IC test apparatus, comprising:

a pattern of pads on a first side of the load board for contact with pins of an external circuit;

plated through-holes passing from the first side to a second side, allowing testing of electrical characteristics on the first side from the second side; and a film directly mounted to the first side of the load board, closing the through-holes on the first side but exposing the pads;

wherein the film is of a material self-supporting before application to the load board.

2. A load board as in claim 1 wherein the material is Mylar™ or Kapton™ material.

3. A load board as in claim 1 wherein the film before mounting has a pre-applied adhesive protected with a second film, such that the second film may be peeled before application of the first film to the load board.

4. An IC test apparatus comprising:

a test head having a mounted load board for conducting test vectors to a test site for an IC;

a vacuum chamber fashioned within the test head, the vacuum chamber having an opening defined by vacuum seals with the load board covering the opening against the vacuum seals;

wherein the load board has a pattern of pads on a first side for contact with pins of an external circuit; plated through-holes passing from the first side to a second side, allowing testing of electrical characteristics on the first side from the second side; and a film of a material self-supporting before application to the load board, the film directly mounted to the first side of the load board, closing the through-holes on the first side but exposing the pads.

5. An IC test apparatus as in claim 4 wherein the self-supporting material is Mylar™ or Kapton™ material.

6. An IC test apparatus as in claim 4 wherein the film before mounting has a pre-applied adhesive protected with a second film, such that the second film may be peeled before application of the first film to the load board.

* * * * *